United States Patent [19]

McElroy

[11] 4,282,446

[45] Aug. 4, 1981

[54] HIGH DENSITY FLOATING GATE EPROM PROGRAMMABLE BY CHARGE STORAGE

[75] Inventor: David J. McElroy, Houston, Tex.

[73] Assignee: Texas Instruments Incorporated, Dallas, Tex.

[21] Appl. No.: 80,712

[22] Filed: Oct. 1, 1979

[51] Int. Cl.³ .................. H03K 5/00; G11C 11/40; H01L 29/78; H01L 27/02
[52] U.S. Cl. .................. 307/238.5; 357/23; 357/41; 357/54; 357/59; 365/185
[58] Field of Search .................. 357/23, 41, 54, 59; 307/238; 365/185

[56] References Cited

U.S. PATENT DOCUMENTS

| | | | |
|---|---|---|---|
| 4,112,509 | 9/1978 | Wall | 357/54 |
| 4,151,021 | 4/1979 | McElroy | 357/59 |
| 4,184,207 | 1/1980 | McElroy | 357/23 |

Primary Examiner—Gene M. Munson
Attorney, Agent, or Firm—John G. Graham

[57] ABSTRACT

A floating gate type electrically programmable memory device is made by an N-channel double-level polysilicon self-aligned process which results in a very dense array. The programming inefficiency caused by inherent resistance of elongated diffused regions used as column lines is overcome by a capacitive discharge programming method. Distributed capacitance of the column lines is charged to the programming voltage before the selected row line is brought to a high voltage, producing a pulse of current through the cell. A series of these programming pulses may be used.

13 Claims, 6 Drawing Figures

HIGH DENSITY FLOATING GATE EPROM PROGRAMMABLE BY CHARGE STORAGE

BACKGROUND OF THE INVENTION

This invention relates to semiconductor memory devices, and more particularly to an electrically programmable floating gate type MOS memory.

Electrically programmable memory devices of the floating gate type are disclosed in U.S. Pat. No. 4,112,509 issued to Lawrence S. Wall and my U.S. Pat. No. 4,122,544, both assigned to Texas Instruments, or U.S. Pat. No. 3,984,822, issued to Simko et al. These EPROM devices are programmed by electron tunnelling through the gate oxide which occurs when high current is produced in the channel. The programming efficiency can degrade when series resistance in the path of the programming current lowers the voltage drop across the cell being programmed. This effect is avoided in devices made according to the above-mentioned patents by using metal bit lines and making metal-to-silicon contacts to each cell. While performance is excellent in this regard, the cell size is too large for very dense "VLSI" arrays.

A method for making a very high density EPROM array is disclosed in my U.S. Pat. No. 4,151,021, assigned to Texas Instruments. In this device, elongated N+ diffused moat regions are used as the bit lines, with no metal lines and no contacts. While the density is very high, the problem of series resistance of the bit lines is accentuated.

It is the principal object of the invention to provide an improved electrically programmable semiconductor memory cell. Another object is to provide an electrically programmable cell which is of small cell size when formed in a semiconductor integrated circuit and which can be programmed efficiently. A further object is to provide a method for programming dense arrays of electrically programmable memory cells, without reliance upon individual contacts to each cell.

SUMMARY OF THE INVENTION

In accordance with an embodiment of the invention, a floating gate type electrically programmable memory device is made by an N-channel double-level polysilicon self-aligned process which results in a very dense array. The programming inefficiency caused by inherent resistance of elongated diffused regions used as column lines is overcome by a capacitive discharge programming method. Distributed capacitance of the column lines is charged to the programming voltage before the selected row line is brought to a high voltage, producing a pulse of current through the cell. A series of these programming pulses may be used.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

DETAILED DESCRIPTION OF SPECIFIC EMBODIMENT

Figure 1:
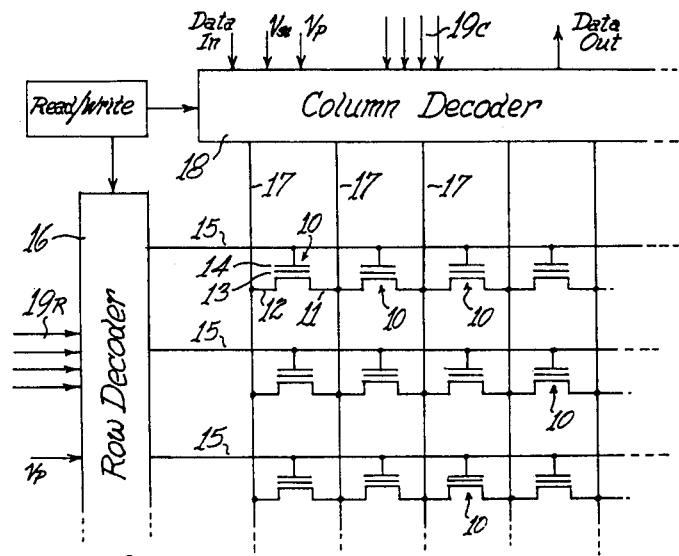
FIG. 1 is an electrical schematic diagram of an array of memory cells which may be programmed according to the invention.

Referring now to FIG. 1, an array of memory cells is shown which may be made according to the invention set forth in my U.S. Pat. No. 4,151,021. Each cell is a floating gate transistor 10 having a source 11, a drain 12, a floating gate 13 and a control gate 14. (The terms "source" and "drain" refer to read operations. For programming, the functions are reversed.) All of the gates 14 in each row of cells are connected to one of the row address lines 15, and all of the row address lines 15 are connected to a row decoder 16. All of the source and drain electrodes 11 or 12 in a column of cells are connected to one of a set of identical column lines 17, and the source and drain column lines 17 are connected at each end to a column decoder 18. In a write or program mode, the column decoder functions according to the invention to apply either a high voltage (about +25 v.) or a low voltage (ground or Vss, or Vbb, depending upon process) selectively to each source and drain column line 17, in response to a column address on lines 19c and to whether a "0" or "1" is to be written. For write or program operations, the row decoder 16 function to apply a high voltage Vp or a low voltage (Vss or ground) to each of the row lines 15 in response to a row address on lines 19R. For a read operation no high voltage Vp is used; the column decoder 18 grounds the line 17 to the right of the selected cell and connects a static load to the column line 17 on the left, using a decode arrangement as in FIG. 14 of U.S. Pat. No. 3,988,604, issued Oct. 26, 1976, to J. H. Raymond, assigned to Texas instruments. The row decoder 16 applies a logic "1" or Vdd voltage to the selected row line 15 and applies a logic "0" or Vss to all other row line 15.

Figure 2:
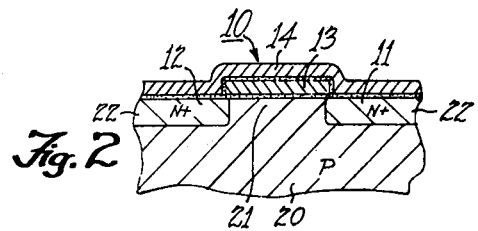
FIG. 2 is an enlarged sectional view of one of the memory cells in the array of FIG. 1.

The structure of one of the cells is seen in a greatly enlarged sectional view in FIG. 2. The cell is formed in a semiconductor substrate 20 which is P-type silicon for the N-channel silicon gate MOS transistors herein described. The transistor 10 of the cell is created by a channel region 21 between N+ type regions 22 which are the source 11 and drain 12. The channel region 21 lies beneath the floating gate 13 which is composed of N+ doped polycrystalline silicon. The floating gate 13 is insulated from the underlying channel region 21 by a gate oxide layer 23, a thickness of perhaps 800 Å. The control gate 14 is also composed of N+ doped polycrystalline silicon extending along the face as the row line 15. The control gate 14 is isolated from the floating gate by an insulating layer 24 which may be of a thickness of perhaps 1500 Å. The cell is programmed by holding the source 11 at high voltage (Vp, about +25 v) and the drain 12 at Vss while the control gate 14 is at Vp, whereupon the level of current through the channel 21 is such that electrons are injected through the oxide 23 and charge the floating gate 13. Once charged, the floating gate stays in this condition indefinitely, and subsequently the apparent threshold voltage of the transistor is greatly increased, to perhaps Vdd or greater. The array is deprogrammed by exposing to ultraviolet light.

Figure 3:
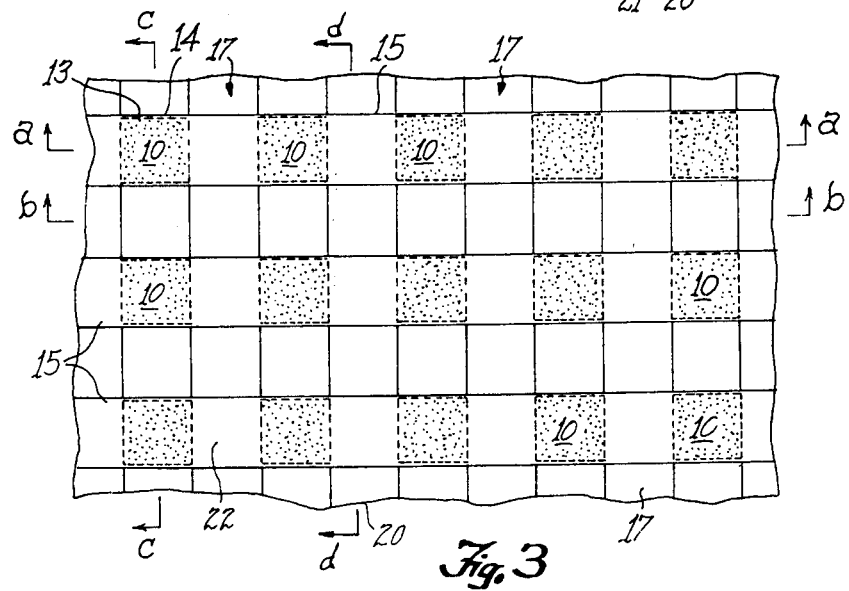
FIG. 3 is a plan view of a part of a semiconductor integrated circuit chip containing an array of the cells of FIGS. 1 and 2.
Figure 4:
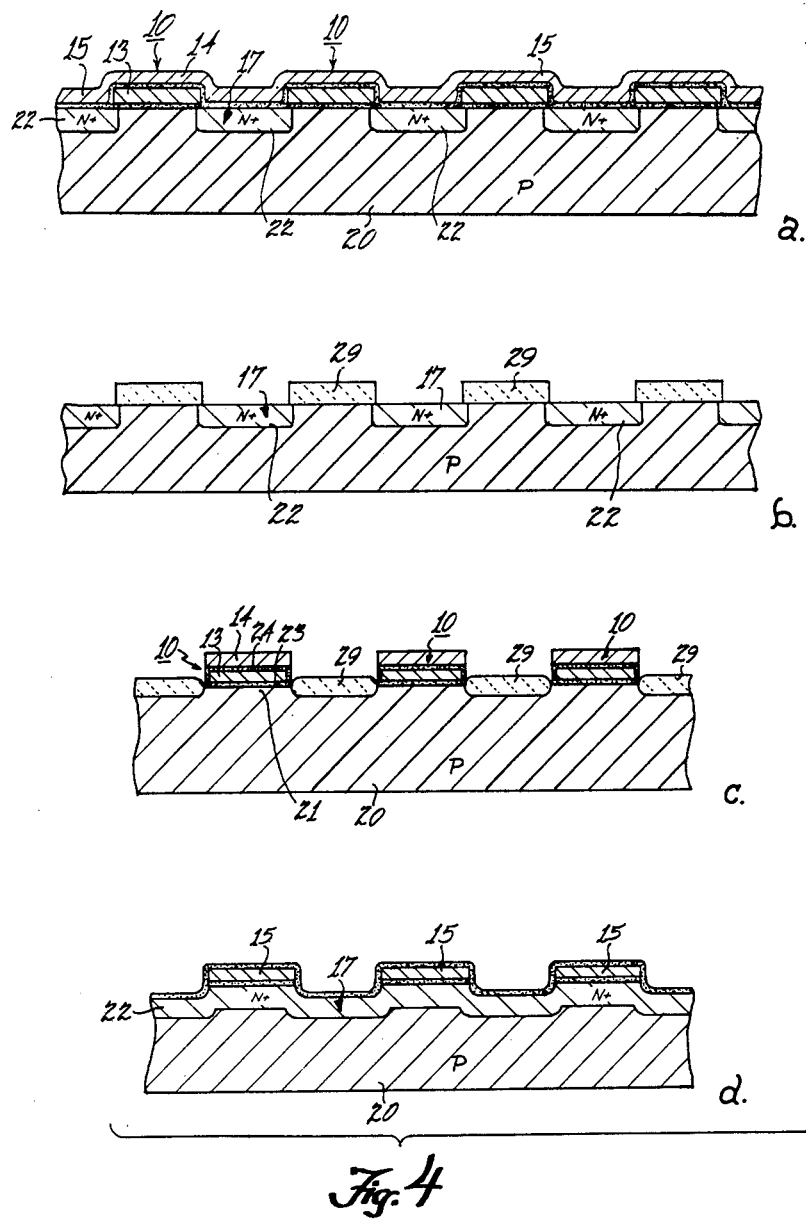
FIGS. 4a–4d are elevation views in section of the array of FIG. 3, taken along the lines a—a, b—b, c—c, and d—d respectively, in FIG. 3.

Referring now to FIG. 3, a part of a cell array according to the invention is illustrated. FIGS. 4a to 4d are sectional views of the device of FIG. 3, as is FIG. 2, showing details of construction. The area shown in FIG. 3 is about 0.6 mils by 1.0 mils in size; the entire cell array may contain, for example, 65,536 cells ($2^{16}$) or 131,072, cells ($2^{17}$), or other power of two. The twelve transistors 10 for the cells shown are created in three parallel elongated areas forming the rows of cells which have thick field oxide 29 on each side. These areas are referred to in the terminology of the industry as "moats"; with the thick field oxide in place the transistors are in depressed areas on the face of the slice, as viewed under a microscope. N+ diffused regions 22 in the moats form interconnections between the cells and the sources and drains of the transistors, creating the rows of cells as well as the column lines 17. Elongated parallel strips of polycrystalline silicon form the address lines 15 and the control gates 14 of the transistors. The floating gates 13 are buried beneath the strips 15. The simplified structure and manufacturing technique of my U.S. Pat. No. 4,151,021 allows the sources, drains, rows and column lines to be formed and interconnected in one diffusion masking operation with a very dense layout, such patent is incorporated herein by reference. Of course, the features of the invention may be used in EPROM devices made by other processes.

Figure 5:
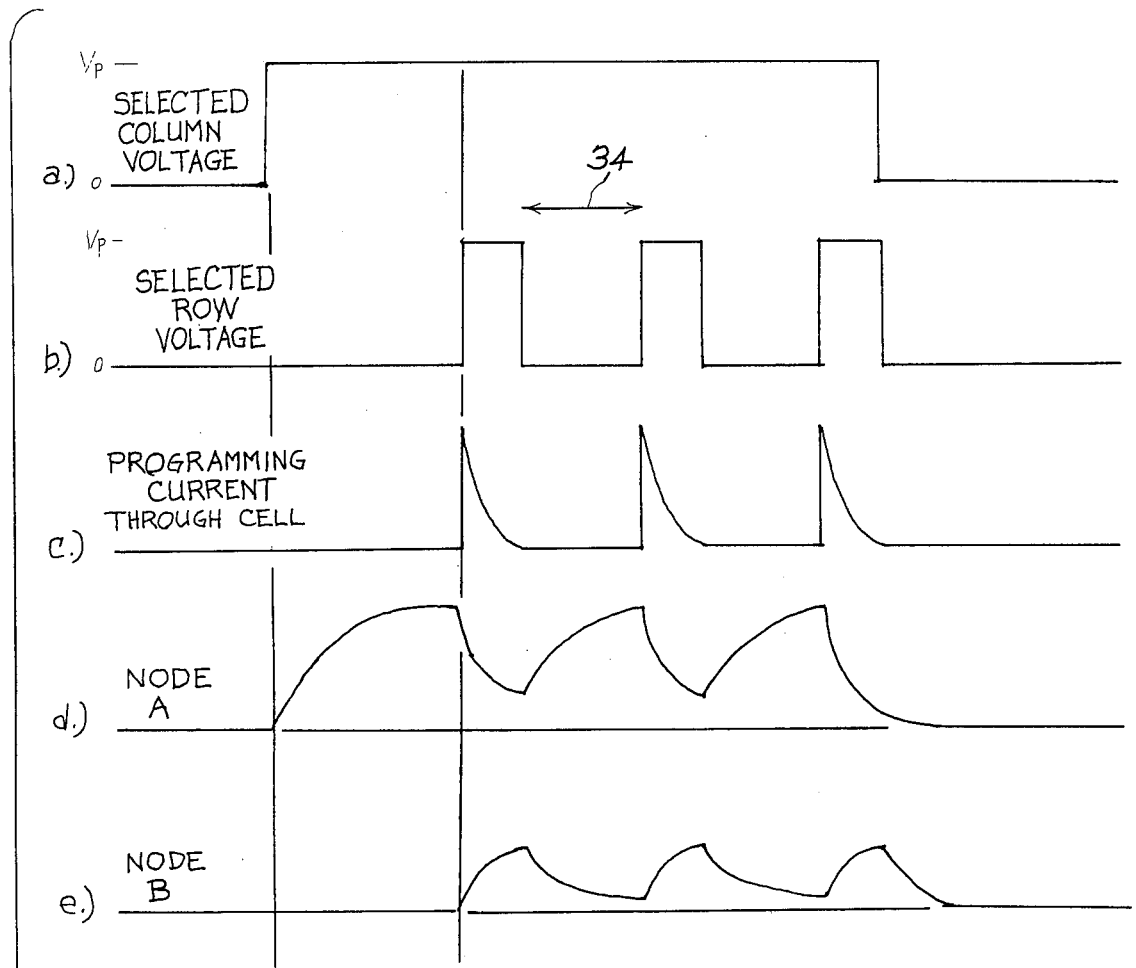
FIGS. 5a–5e are graphic representations of voltage or current vs. time appearing at various points in the device of FIGS. 1–4.
Figure 6:
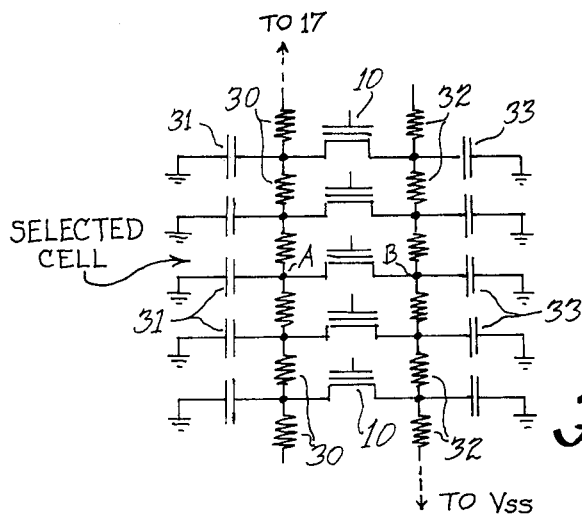
FIG. 6 is an electrical schematic diagram of an equivalent circuit for a part of the device of FIGS. 1–4.

According to the invention, the cells are programmed by charging the distributed capacitance of the selected column line 17 for a time interval before the selected row line 15 is brought high. This serves to improve programming. The resistance of the N+ regions 22 which form the column lines 17 can be so high that the current in the channel 21 is not sufficiently high to program the cells properly using conventional methods. As shown in FIG. 5a, the Vp voltage on the selected line 17 goes high before the voltage goes high on the line 15, as seen in FIG. 5b. Thus the current to ground in the channel 21 of the selected cell will be a pulse as seen in FIG. 5c. The voltage at the source of a given cell is as shown in FIG. 5d; a finite time is required for the distributed capacitance of the regions 22 to charge up through the series resistance of the elongated moat region. The selected column line 17 for output may be thought of as (for the 64K example) 256 series resistors 30 with a capacitor 31 at each juncture as seen in FIG. 6. The selected ground line is likewise resistors 32 with capacitors 33. During the programming pulse of FIG. 5b, the capacitance 31 in the area of the cell can discharge through the selected channel 21 to charge the capacitor 33 on the ground side without the resistors 30 or 32 in series with the discharge path, whereas if the Vp voltage on the end of a column line were relied upon as in conventional devices then the drop across the series resistance degrades the effectiveness of programming.

Several programming pulses may be used instead of only one. With the selected column line 17 held at Vp, as soon as the row line voltage (FIG. 5b) returns to Vss, the column line voltage causes the capacitance 31 to begin to charge again, while the capacitance 33 on the ground side will begin to discharge through the resistors 32, see FIG. 5e. Another pulse of FIG. 5b appears on the selected row line after a time period 34 which allows the capacitor 31 to be near Vp and the capacitor 33 to be near Vss. The cycle is repeated for as many times as needed for proper programming.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed:

1. A method of programming a memory cell of the type having a source-drain path in a semiconductor substrate, and a floating gate and a control gate over said source-drain path, comprising the steps of applying a programming voltage to one end of the source-drain path and connecting the other end to reference potential for a sufficient time to charge the capacitance of said one end to substantially said programming voltage while the voltage on said control gate is substantially at said reference potential, and thereafter applying a high voltage to said control gate to render said source-drain path highly conductive and thereby charge the floating gate.

2. A method according to claim 1 wherein said floating gate is charged by electrons tunnelling through a dielectric layer between said source-drain path and the floating gate when the source-drain path is highly conductive.

3. A method according to claim 2 wherein a plurality of said cells are included in an array of rows and columns, and each column has a plurality of source-drain paths of cells connected between such column and a parallel column, and said step of applying programming voltage uses such column as a conductor.

4. A method according to claim 3 wherein each row is connected to said control gates of a plurality of said cells, and the step of applying a high voltage uses a row as a conductor.

5. A method according to claim 4 wherein said high voltage is about the same as said programming voltage and both are much greater than threshold voltage for the cell.

6. An electrically programmable semiconductor memory device comprising an array of rows and columns of memory cells at a face of a semiconductor body, each cell having a control gate at said face connected by a row line to control gates of all cells in a row, each cell having a source-drain path in said face connected at its ends to adjacent column lines, a floating gate between said source-drain path and control gate in each cell, means for charging the capacitance of a selected one of the column lines to a programming voltage over a time interval, means for maintaining the control gates of all cells in the array at a level causing the source-drain paths to be non-conductive during said time interval, and means for connecting a selected one of said row lines to a high voltage at a time beginning after said time interval to cause charging of the floating gate of one of the cells by electron tunnelling through an insulator between the source-drain path and the floating gate.

7. A device according to claim 6 wherein said programming voltage and said high voltage are about the same level and both are much higher than the threshold voltage which turns on the source-drain path in a normal read operation.

8. A device according to claim 7 wherein means are connected to said column lines for coupling a column line adjacent said selected one to reference potential.

9. A device according to claim 8 wherein said time interval is much greater than the cycle time of a read operation.

10. A method of programming a memory cell of the type having a source-drain path in a face of a semiconductor body, a floating gate and a control gate over said source-drain path, comprising the steps of applying a programming voltage to one end of the source-drain path for a sufficient time to charge the capacitance of said one end to substantially said programming voltage while the voltage one said control gate is at a potential which prevents conduction of said source-drain path, and thereafter applying a high voltage to said control gate to render said source-drain path highly conductive and thereby charge said floating gate.

11. A method according to claim 10 wherein said floating gate is charged by electrons tunnelling through a dielectric layer between said source-drain path and the floating gate when the source-drain path is highly conductive.

12. A method according to claim 10 wherein the step of applying said high voltage to the control gate comprises applying a high voltage pulse and such step is repeated at least once.

13. A method according to claim 12 wherein a plurality of said steps of applying a high voltage pulse to the control gate are employed while said one end of the source-drain path is maintained at said programming voltage.

* * * * *